(12) United States Patent
Hsu et al.

(10) Patent No.: US 9,087,463 B2
(45) Date of Patent: Jul. 21, 2015

(54) BACKLIGHT MODULE AND DISPLAY DEVICE WITH TWO-SIDED LIGHT EMITTING STRUCTURE

(75) Inventors: Chih-Hua Hsu, New Taipei (TW); Jung-Shiung Liau, New Taipei (TW); Chin-Hsien Chen, New Taipei (TW); Gustavo Salazar, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 967 days.

(21) Appl. No.: 13/088,435

(22) Filed: Apr. 18, 2011

(65) Prior Publication Data

US 2011/0280003 A1 Nov. 17, 2011

(30) Foreign Application Priority Data

May 14, 2010 (TW) ................................ 99115455 A

(51) Int. Cl.
| | | |
|---|---|---|
| G09F 13/04 | (2006.01) | |
| G02F 1/1335 | (2006.01) | |
| H05K 1/18 | (2006.01) | |
| G02F 1/1333 | (2006.01) | |
| G09F 13/22 | (2006.01) | |
| H05K 1/02 | (2006.01) | |
| H05K 3/00 | (2006.01) | |

(52) U.S. Cl.
CPC .......... G09F 13/04 (2013.01); G02F 1/133603 (2013.01); H05K 1/189 (2013.01); *G02F 2001/133342* (2013.01); *G02F 2001/133628* (2013.01); *G09F 2013/222* (2013.01); *H05K 1/0203* (2013.01); *H05K 3/0061* (2013.01); *H05K 2201/10106* (2013.01)

(58) Field of Classification Search
CPC ............................................ G02F 2001/133342
USPC .................................. 362/97.1, 227, 249.02
See application file for complete search history.

(56) References Cited

U.S. PATENT DOCUMENTS

| | | | |
|---|---|---|---|
| 6,741,301 B2 * | 5/2004 | Tsuji ................................ 349/58 |
| 6,882,380 B2 * | 4/2005 | Yu et al. ........................... 349/61 |
| 7,458,710 B2 * | 12/2008 | Moon ............................ 362/615 |
| 8,098,349 B2 * | 1/2012 | Hung et al. ...................... 349/67 |
| 2006/0082987 A1 * | 4/2006 | Dorsey et al. ................. 362/103 |
| 2008/0219025 A1 * | 9/2008 | Spitzer et al. ................. 362/609 |
| 2008/0244944 A1 * | 10/2008 | Nall et al. ........................ 40/544 |
| 2010/0254117 A1 * | 10/2010 | Hsu et al. ...................... 362/97.1 |
| 2010/0328947 A1 * | 12/2010 | Chang et al. ............. 362/249.02 |

FOREIGN PATENT DOCUMENTS

TW 200426459 12/2004
TW 200717757 5/2007

OTHER PUBLICATIONS

Office action mailed on Mar. 18, 2013 for the Taiwan application No. 099115455, filing date: May 14, 2010, p. 1 line 12-14, p. 2 line 1-6, line 10-13, line 16-18 and line 21-24 and p. 3 line 2-9 and line 11-16.

* cited by examiner

*Primary Examiner* — Mary McManmon
(74) *Attorney, Agent, or Firm* — Winston Hsu; Scott Margo

(57) ABSTRACT

A backlight module includes a flexible circuit board. The flexible circuit board includes a conductive layer and an insulating layer covering the conductive layer. The backlight module further includes a plurality of light emitting diodes respectively disposed on two sides of the flexible circuit board and electrically connected to the conductive layer of the flexible circuit board for emitting light towards the two sides of the flexible circuit board.

6 Claims, 6 Drawing Sheets

# BACKLIGHT MODULE AND DISPLAY DEVICE WITH TWO-SIDED LIGHT EMITTING STRUCTURE

BACKGROUND OF THE INVENTION

1. Field of the Invention

The present invention relates to a backlight module and a display device with a two-sided light emitting structure, and more specifically, to a backlight module and a display device with a plurality of light emitting diodes disposed on two sides of a flexible circuit board respectively to achieve two-sided lighting effect.

2. Description of the Prior Art

Since liquid crystal is incapable of emitting light, so a backlight module can be regarded as a key component of a liquid crystal display (LCD) panel. The major function of the backlight module is to provide a light source with sufficient brightness and uniform distribution, so as to make the LCD panel display images normally. As the LCD panels are applied to many progressing electronics, such as monitors, notebook computers, digital cameras, projectors and so on, demands of the backlight modules and related components thereof are increasing continuously. The application of light emitting diodes (LEDs) has been developed continuously in past few years. The LEDs belong to cold light, so the LEDs have the advantages of low power consumption, long term service life, without warming up time, rapid reaction speed, small size, durable for vibration, suitable for mass production, being minimized or array-arranged to conform with the demands easily, such that the LEDs have been applied as the light sources of the backlight modules widely.

Generally speaking, the backlight modules with a two-sided light emitting structure can be applied to compact products, such as LCD TV, notebook computers and so on, or to outdoor display devices, such as a large billboard. The backlight module with the two-sided light emitting structure can provide two-sided displaying effect with one set of light sources. The conventional two-sided backlight module mostly utilizes the cold cathode fluorescent lamp (CCFL) as the light source. However, the CCFL has the drawbacks of bad color rendering, high driven voltage, environmental pollution with mercury, emitting ultraviolet light, slow starting speed, light tubes broken easily, difficulty in controlling chroma, and so on. Therefore, the LEDs are taken as the light resource of the two-sided backlight module to solve the drawbacks mentioned above. Please refer to FIG. 1. FIG. 1 is a schematic diagram of a conventional two-sided backlight module 10. The two-sided backlight module 10 includes two LED light bars 12. Each LED light bar 12 includes a base 14 and a plurality of light emitting diodes 16 disposed on the base 14. The base 14 is usually made of aluminum material or fiber glass material for supporting the plurality of light emitting diodes 16. In order to get the effect of the two-sided backlight, the two-sided backlight module 10 requires the double LED light bars 12, so as to increase manufacture cost and assembly thickness. Besides, the aluminum base or fiber glass base requires extra wires to electrically connect to a DC power supply, so as to provide electric power for the LED light bars 12, and it increases cost as well. Furthermore, in order to enhance the dissipating efficiency of the two-sided backlight module 10, a metal plate 18 is usually disposed between the two LED light bars 12. The two LED light bars 12 can be attached on two sides of the metal plate 18. Accordingly, the metal plate 18 can dissipate heat generated by the plurality of light emitting diodes 16 of the two LED light bars 12, but the metal plate 18 also increases the total assembly thickness. Thus, design of a two-sided light emitting backlight module with low cost and small size is an important issue nowadays.

SUMMARY OF THE INVENTION

The present invention provides a backlight module and a display device with a two-sided light emitting structure to solve the problems mentioned above.

According to the claimed invention, a backlight module includes a flexible circuit board. The flexible circuit board includes a conductive layer and an insulating layer covering the conductive layer. The backlight module further includes a plurality of light emitting diodes respectively disposed on two sides of the flexible circuit board and electrically connected to the conductive layer of the flexible circuit board for emitting light towards the two sides of the flexible circuit board.

According to the claimed invention, the backlight module further includes at least one thermal pad disposed between the conductive layer of the flexible circuit board and the light emitting diode.

According to the claimed invention, the backlight module further includes a support member connected to the flexible circuit board for supporting the flexible circuit board.

According to the claimed invention, the support member is a metal plate for dissipating heat generated by the plurality of the light emitting diodes.

According to the claimed invention, at least one opening is formed on the support member, and the flexible circuit board passes through the opening so as to dispose the plurality of the light emitting diodes on two sides of the support member respectively.

According to the claimed invention, a display device includes a casing, two panel units disposed inside the casing respectively and a backlight module installed inside the casing and disposed between the two panel units for providing the two panel units with light, the backlight module includes a flexible circuit board. The flexible circuit board includes a conductive layer and an insulating layer covering the conductive layer. The backlight module further includes a plurality of light emitting diodes respectively disposed on two sides of the flexible circuit board and electrically connected to the conductive layer of the flexible circuit board for emitting light towards the two sides of the flexible circuit board.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
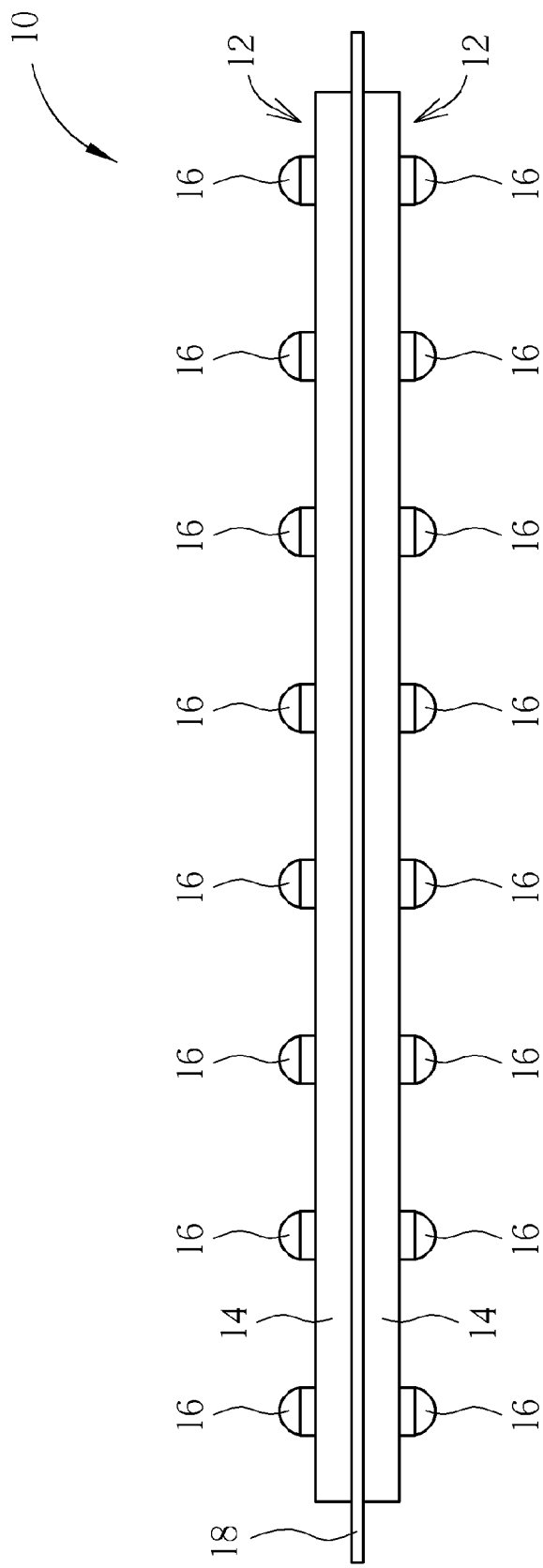
FIG. 1 is a schematic diagram of a conventional two-sided backlight module.
Figure 2:
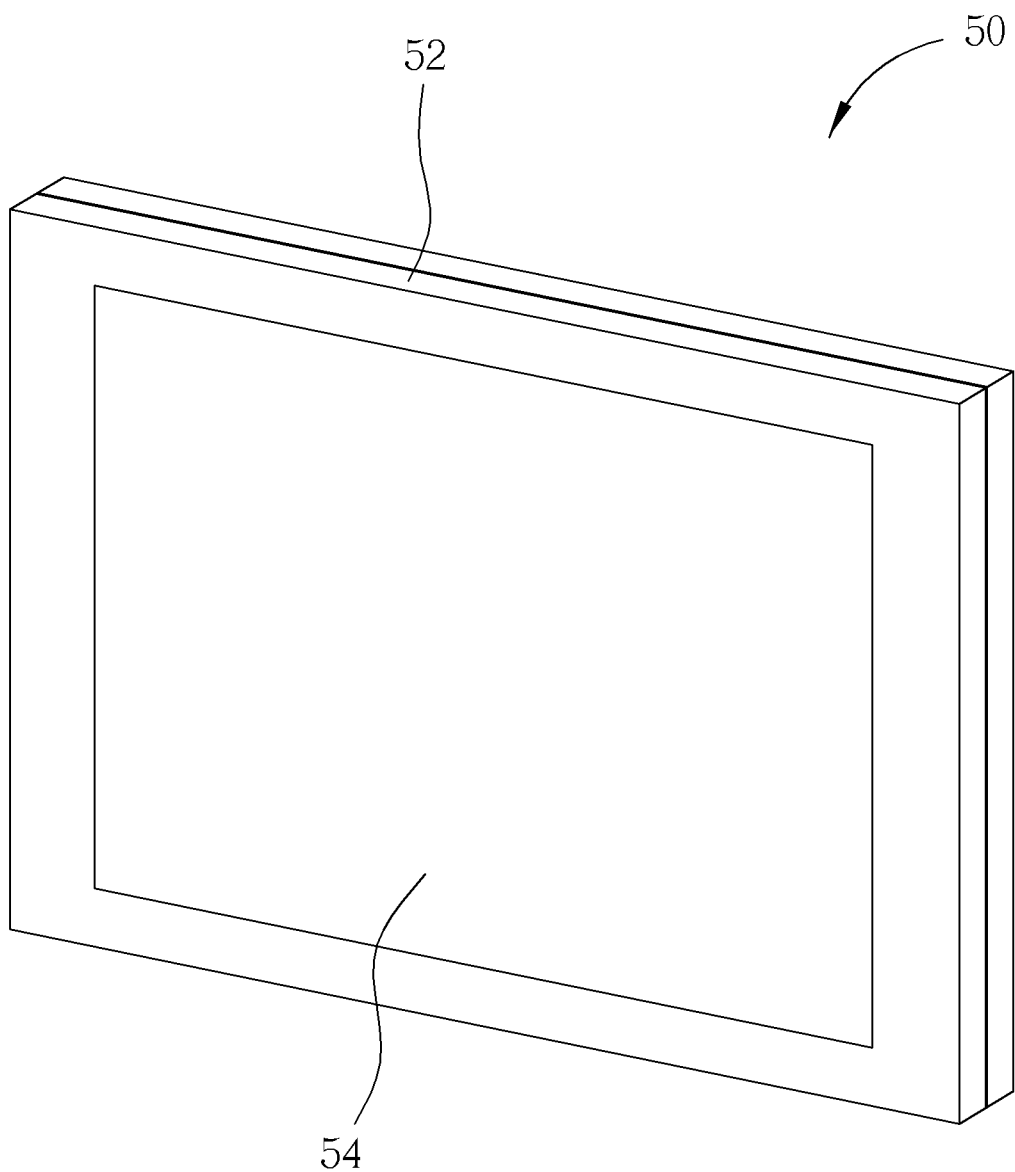
FIG. 2 is a perspective diagram of a display device with a two-sided light emitting structure according to a preferred embodiment of the present invention.
Figure 3:
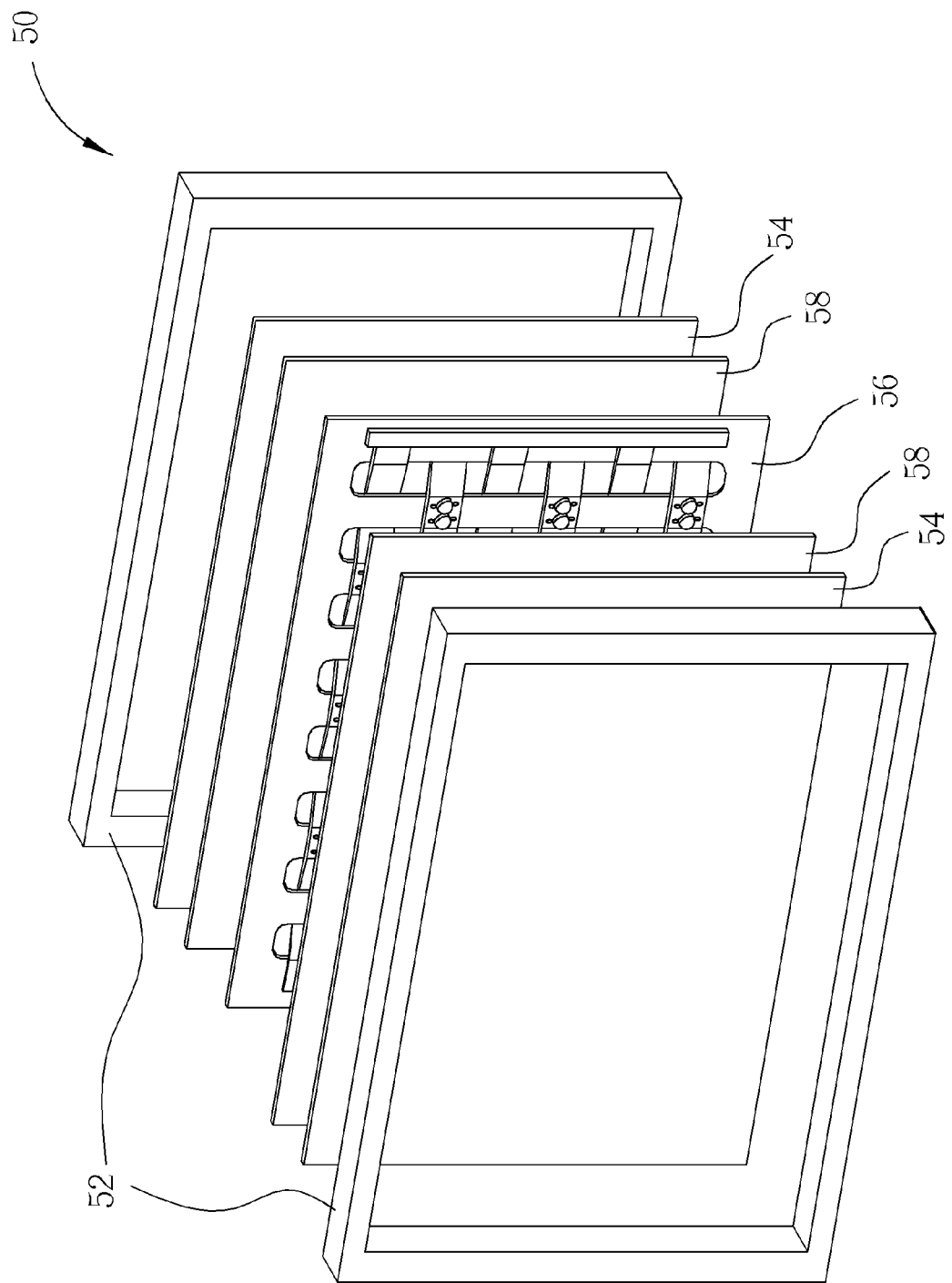
FIG. 3 is an exploded view of the display device according to the preferred embodiment of the present invention.

Please refer to FIG. 2 and FIG. 3. FIG. 2 is a perspective diagram of a display device 50 with a two-sided light emitting structure according to a preferred embodiment of the present invention, and FIG. 3 is an exploded view of the display device 50 according to the preferred embodiment of the present invention. The display device 50 includes a casing 52. The casing 52 can be made of plastic material. The casing 52 is for covering internal components. The display device 50 further includes two panel units 54 disposed inside the casing 52 respectively. Each panel unit 54 can include optical material layers, a liquid display panel and soon. The optical material layers can nebulize and focus light to provide the liquid crystal display panel with a light source with uniform distribution and high brightness in front view. The optical material layers can include optical components, such as prism sheets, diffusers and so on. The display device 50 further includes a backlight module 56 installed inside the casing 52 and disposed between the two panel units 54. The backlight module 56 can provide light for the two panel units 54. That is to say, the backlight module 56 can emit light towards the two sides of the two panel units 54. The display device 50 can selectively include two reflector sheets 58 installed between the two panel units 54 and the backlight module 56. The reflector sheet 58 can reflect light towards the panel unit 54, so as to increase light utilization efficiency.

Figure 4:
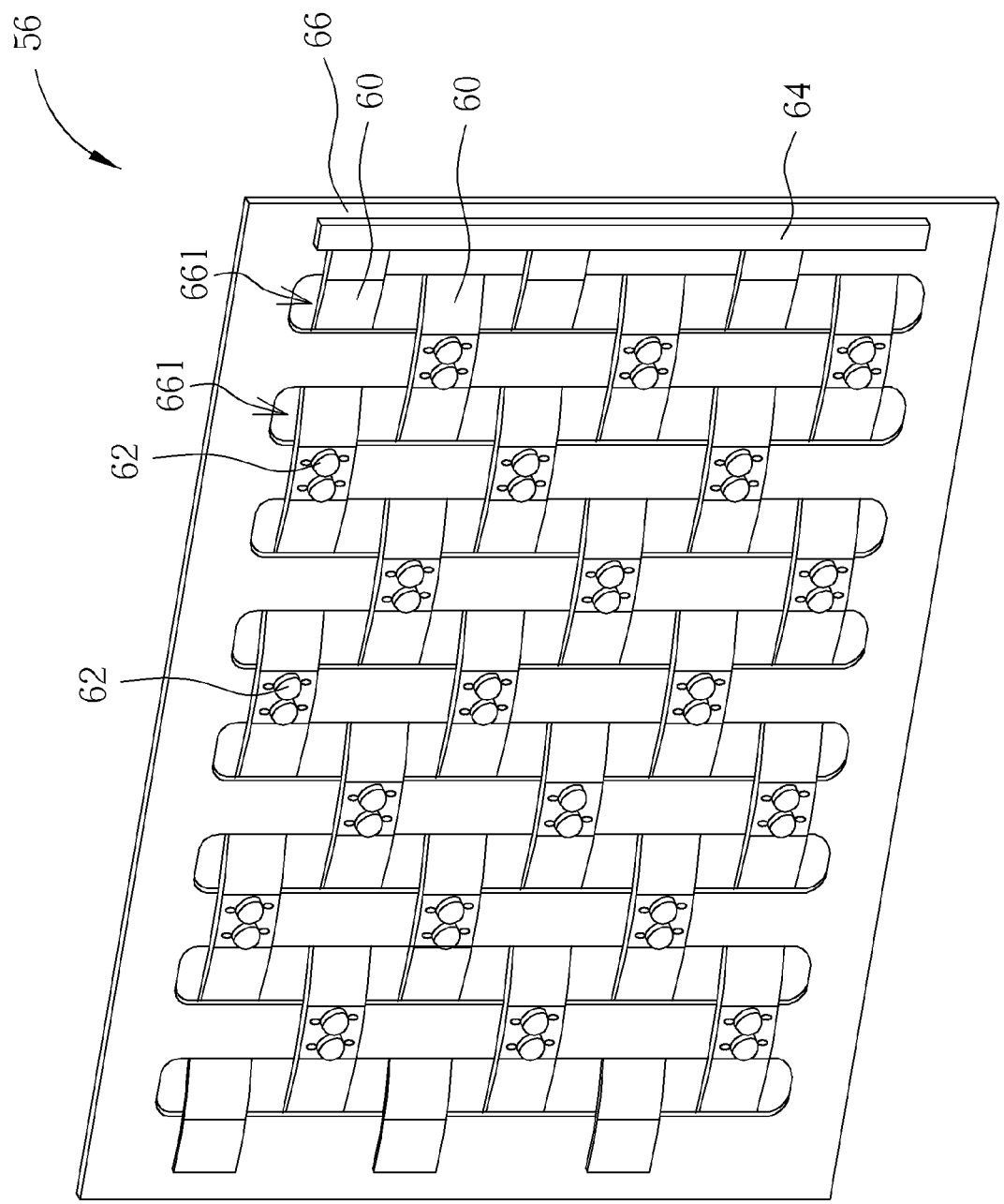
FIG. 4 is a perspective diagram of the backlight module according to the preferred embodiment of the present invention.
Figure 5:
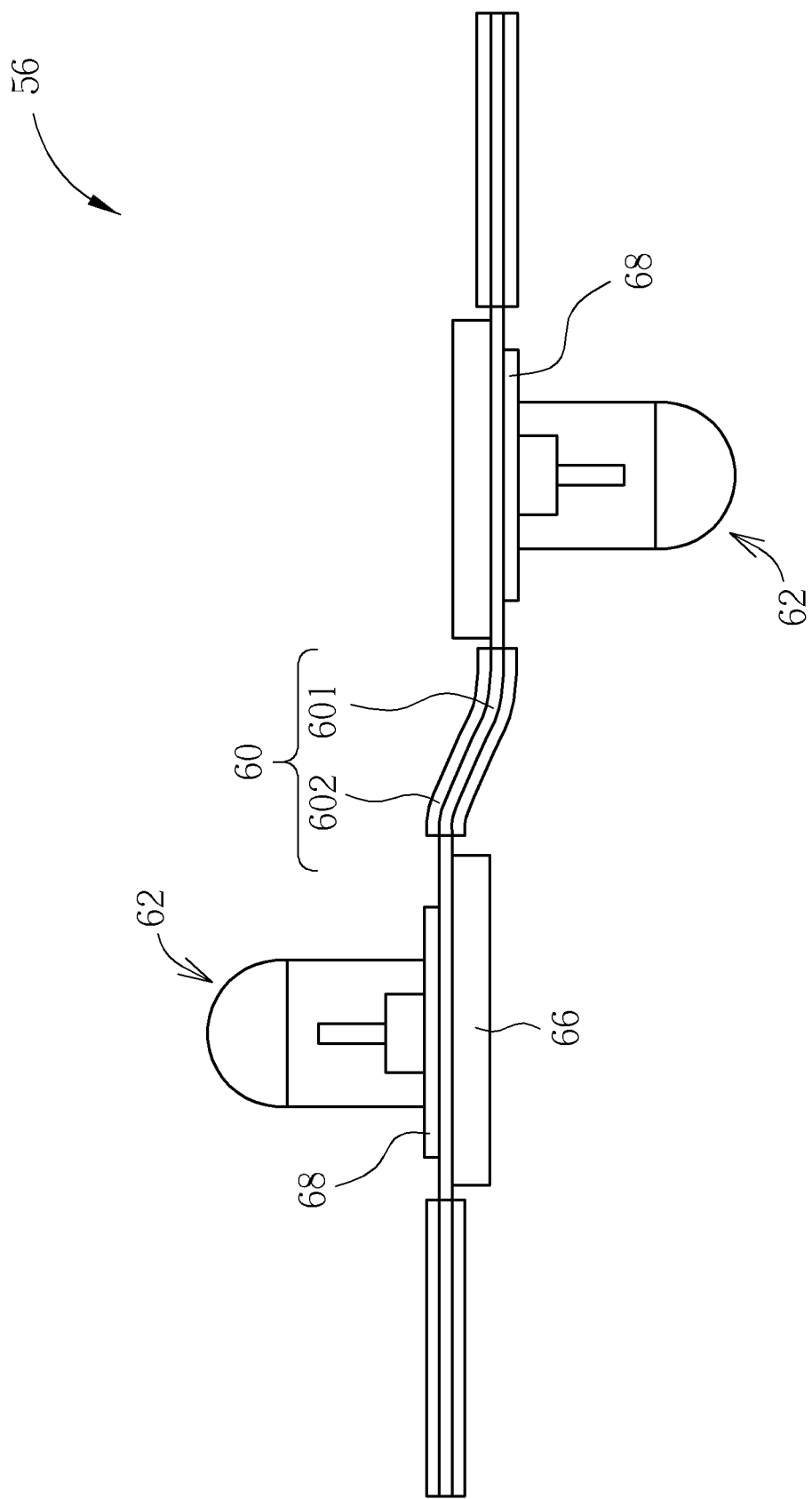
FIG. 5 is a side view of the backlight module according to the preferred embodiment of the present invention.

Please refer to FIG. 4 and FIG. 5. FIG. 4 is a perspective diagram of the backlight module 56 according to the preferred embodiment of the present invention, and FIG. 5 is a side view of the backlight module 56 according to the preferred embodiment of the present invention. The backlight module 56 includes at least one flexible circuit board 60. Each flexible circuit board 60 includes a conductive layer 601. The conductive layer 601 can be made of cupper foil. The flexible circuit board 60 further includes an insulating layer 602 covering the conductive layer 601. The backlight module further includes a plurality of light emitting diodes 62 respectively disposed on the two sides of the flexible circuit board 60 and electrically connected to the conductive layer 601 of the flexible circuit board 60. The plurality of light emitting diodes 62 is utilized to emit light towards the two sides of the flexible circuit board 60, so as to provide light for the two panel units 54. One end of each flexible circuit board 60 can be connected to a connector 64 for receiving direct current required by the plurality of light emitting diodes 62. Since the flexible circuit board 60 can be considered as a conductive medium, only one set of controlling circuit board is needed to control one set of the light emitting diode light bar, so as to save manufacture cost. Besides, the backlight module 56 further includes a support member 66 connected to the flexible circuit board 60 for supporting the flexible circuit board 60, so as to reinforce the structural strength of the flexible circuit board 60. In this embodiment, at least one opening 661 is formed on the support member 66. The flexible circuit board 60 passes through the opening 661, so as to dispose the plurality of the light emitting diodes 62 on the two sides of the support member 66 respectively. That is to say, a weaving structure is presented by the flexible circuit board 60 and the support member 66 due to the flexibility of the flexible circuit board 60, such that the plurality of the light emitting diodes 62 can be disposed on the two sides of the support member 66 interlacedly. The number of the flexible circuit boards 60, the number of the openings 661 of the support member 66, a distance between each opening 661, a distance between each flexible circuit board 60, an angle formed by the interlacement of the flexible circuit board 60 and the support member 66, and the arrangement of the light emitting diodes 62 disposed on the two sides of the support member 66 interlacedly, are not limited to the drawings in this embodiment, and it depends on actual design demand. Besides, in order to increase the dissipating efficiency of the backlight module 56, the support member 66 can be a metal plate for dissipating heat generated by the plurality of the light emitting diodes 62. The backlight module 56 further includes at least one thermal pad 68 disposed between the conductive layer 601 of the flexible circuit board 60 and the light emitting diode 62, so as to transmit heat generated by the light emitting diodes 62 to the metal plate. The thermal pad 68 not only has the effect of dissipating heat but also can have stickiness, such that the thermal pad 68 can fix the flexible circuit board 60 to the support member 66.

Figure 6:
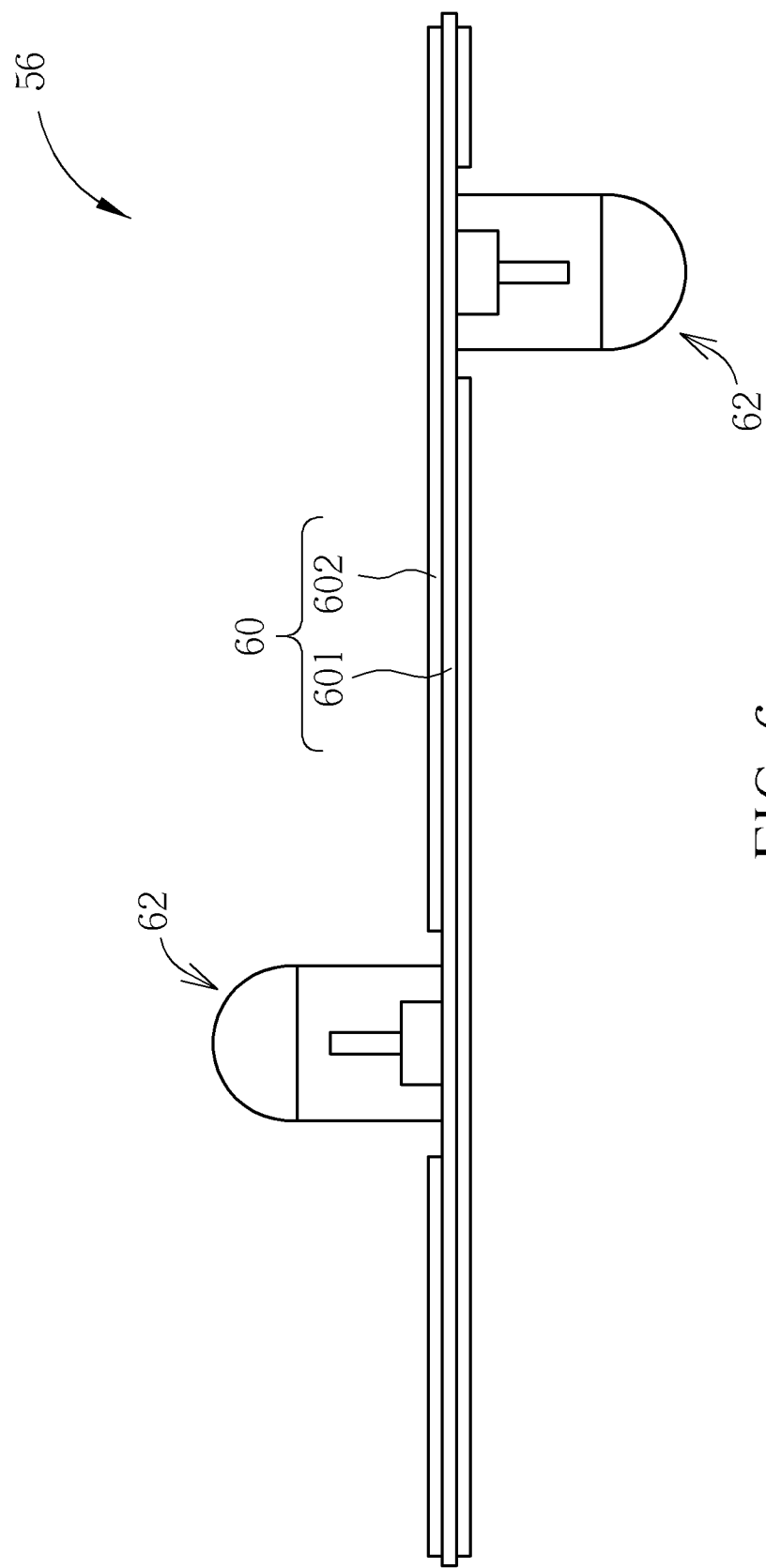
FIG. 6 is a side view of the backlight module according to another embodiment of the present invention.

Furthermore, the backlight module 56 can selectively include the support member 66 and the thermal pad 68 of the present invention. Please refer to FIG. 6. FIG. 6 is a side view of the backlight module 56 according to another embodiment of the present invention. In this embodiment, the plurality of light emitting diodes 62 can be respectively disposed on the two sides of the flexible circuit board 60 and directly connected to the conductive layer 601 of the flexible circuit board 60, so as to omit the disposal of the support member 66 and the thermal pad 68. The plurality of light emitting diodes 62 emits light towards the two sides of the flexible circuit board 60, so as to provide the light sources for the two panel units 54. The working principle is similar to the embodiment mentioned above, so it will not be depicted again herein.

In contrast to the prior art, the backlight module and the display device of the present invention can dispose the plurality of light emitting diodes respectively on two sides of the flexible circuit board, so as to achieve two-sided lighting effect by respectively providing light sources for the two panel units. It can improve the drawbacks of performance limitation and environmental pollution due to utilization of the cold cathode fluorescent lamp as the light source of the two-sided backlight module. The present invention has the advantages of low manufacture cost and small assembly thickness. Furthermore, the weaving structure is presented by the flexible circuit board and the metal plate due to the flexibility of the flexible circuit board, and it provides favorable heat dissipating efficiency as well.

Those skilled in the art will readily observe that numerous modifications and alterations of the device and method may be made while retaining the teachings of the invention.

What is claimed is:
1. A backlight module comprising:
a flexible circuit board comprising a conductive layer and an insulating layer covering the conductive layer;
a plurality of light emitting diodes respectively disposed on two sides of the flexible circuit board and electrically connected to the conductive layer of the flexible circuit board for emitting light towards the two sides of the flexible circuit board; and
a support member connected to the flexible circuit board for supporting the flexible circuit board, a plurality of openings being formed on the support member, and the flexible circuit board passing through the plurality of openings so as to dispose the plurality of the light emitting diodes on two sides of the support member interlacedly, wherein the support member is a plate structure so as to reinforce structural strength of the flexible circuit board.

2. The backlight module of claim 1, wherein the support member is a metal plate for dissipating heat generated by the plurality of the light emitting diodes.

3. The backlight module of claim 1, further comprising at least one thermal pad disposed between the conductive layer of the flexible circuit board and the corresponding light emitting diode, so as to transmit heat generated by the corresponding light emitting diode to the support member.

4. A display device comprising:

a casing;

two panel units disposed inside the casing respectively; and a backlight module installed inside the casing and disposed between the two panel units for providing the two panel units with light, the backlight module comprising:

a flexible circuit board comprising a conductive layer and an insulating layer covering the conductive layer;

a plurality of light emitting diodes respectively disposed on two sides of the flexible circuit board and electrically connected to the conductive layer of the flexible circuit board for emitting light towards the two sides of the flexible circuit board; and a support member connected to the flexible circuit board for supporting the flexible circuit board, a plurality of openings being formed on the support member, and the flexible circuit board passing through the plurality of openings so as to dispose the plurality of the light emitting diodes on two sides of the support member interlacedly, wherein the support member is a plate structure so as to reinforce structural strength of the flexible circuit board.

5. The display device of claim 4, wherein the support member is a metal plate for dissipating heat generated by the plurality of the light emitting diodes.

6. The display device of claim 4, further comprising at least one thermal pad disposed between the conductive layer of the flexible circuit board and the corresponding light emitting diode, so as to transmit heat generated by the corresponding light emitting diode to the support member.

\* \* \* \* \*